United States Patent
Kumagai et al.

(10) Patent No.: US 6,255,862 B1
(45) Date of Patent: Jul. 3, 2001

(54) LATCH TYPE SENSE AMPLIFIER CIRCUIT

(75) Inventors: Kouichi Kumagai; Hiroaki Iwaki, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/502,231

(22) Filed: Feb. 11, 2000

(30) Foreign Application Priority Data

Feb. 12, 1999 (JP) .................................................. 11-034918

(51) Int. Cl.$^7$ ...................................................... H03F 3/45
(52) U.S. Cl. .................................... 327/51; 327/52; 327/57
(58) Field of Search .................................... 327/55, 57, 51, 327/52, 53, 54, 56, 63, 64, 65; 365/189, 207

(56) References Cited

U.S. PATENT DOCUMENTS 5,828,614 * 10/1998 Gradinariu ............................ 365/208
5,920,208 * 7/1999 Park ...................................... 327/54

FOREIGN PATENT DOCUMENTS

| | | |
|---|---|---|
| 4-119597 | 4/1992 | (JP) . |
| 5-325569 | 12/1993 | (JP) . |
| 7-141874 | 6/1995 | (JP) . |
| 8-273370 | 10/1996 | (JP) . |
| 9-22597 | 1/1997 | (JP) . |

* cited by examiner

Primary Examiner—Tuan T. Lam
Assistant Examiner—Hiep Nguyen
(74) Attorney, Agent, or Firm—Sughrue, Mion, Zinn, Macpeak & Seas, PLLC

(57) ABSTRACT

A latch type sense amplifier circuit comprises first and second latch circuits which output the same output signals when a potential difference between a bit line pair is equal to or greater than a predetermined value. The first and second latch circuits output different output signals when the potential difference between the bit line pair is less than the predetermined value. The latch type sense amplifier circuit further comprises a comparison result signal generating circuit which compares the output signals from the first and second latch circuits and outputs a signal indicative of the comparison result.

9 Claims, 8 Drawing Sheets

LATCH TYPE SENSE AMPLIFIER CIRCUIT

BACKGROUND OF THE INVENTION

1. Field of the Invention

The present invention relates to a latch type sense amplifier circuit suitable for a static random access memory which operates with a low power supply voltage, and more particularly, to a latch type sense amplifier circuit which is less prone to be affected by variation in characteristics of elements of the circuit.

2. Description of the Related Art

Generally, a current mirror type sense amplifier circuit is used in a conventional semiconductor integrated circuit including a static random access memory (SRAM, hereinafter). The current mirror type sense amplifier stably operates, but its power consumption is large, and this circuit has difficulty in its operating characteristics with low power supply voltage. For this reason, in recent years, the need for reducing the power consumption is increasing as penetration of portable devices increases and especially, a sense amplifier circuit capable of operating with a low power supply voltage is needed.

To meet this need, there has been proposed a latch type sense amplifier circuit capable of operating at a high speed with a low power supply voltage. FIG. 1 is a circuit diagram showing a conventional latch type sense amplifier circuit.

In the conventional latch type sense amplifier circuit, a latch circuit comprises two P-channel MOS transistors MP11 and MP12 as well as two N-channel MOS transistors MN11 and MN12. The two P-channel MOS transistors MP11 and MP12 as well as the two N-channel MOS transistors MN11 and MN12 are designed such that their transistor characteristics are the same for increasing the speed of the sensing operation. More specifically, gate lengths and gate widths of the two P-channel MOS transistors MP11 and MP12 as well as those of the two N-channel MOS transistors MN11 and MN12 are set equal to each other. Logical threshold values of two inverter circuits constituting the latch circuit are set equal to each other.

Further, in the conventional latch type sense amplifier circuit, there is provided a P-channel MOS transistor MP13 connected between a bit line to which a signal D read from a memory cell is transmitted and drains of the transistors MP11 and MN11. In the conventional latch type sense amplifier circuit, there is provided a P-channel MOS transistor MP14 connected between a bit line to which a signal DB read from a memory cell is transmitted and drains of the transistors MP12 and MN12. Further, there is provided an N-channel MOS transistor MN13 connected between a grounding and sources of the transistors MNI1 and MN12. In this manner, in the conventional latch type sense amplifier circuit, one latch circuit is provided for one set of bit lines.

In the conventional latch type sense amplifier circuit thus constituted, ON and OFF of the transistors MP13 and MP14 are switched by a sense amplifier enable signal SAE, thereby controlling the operation of the circuit. The circuit can sense data at high speed with an extremely small potential difference between the pair of bit lines (D and DB).

On the other hand, as the future small-sizing tendency of the device and process technique grows, there is a tendency that the power supply voltage is lowered, the absolute value of the threshold voltage value of MOS transistors to be used is lowered, and OFF current is increased. Further, if a variation in characteristics of the MOS transistors is large, a variation in potential of the pair of bit lines (D and DB) after the rise of the word line largely depends on leak current characteristics of OFF state of a transistor in the SRAM cell connected to non-selected word line. That is, a rate of noise included in a potential difference between the pair of bit lines (D and DB) appearing after the rise of the word line is increased. Therefore, it is necessary to judge whether the potential difference between the pair of bit lines (D and DB) appearing at the time of sensing is significant.

There has been proposed a sense amplifier circuit for a RAM including a pair of latch circuits (Japanese patent Application Laid-open No. 9-22597). The sense amplifier circuit described in this publication is provided with two latch circuits having different reading speeds with respect to power supply voltage, and with a circuit for taking OR logic values of signals output from the latch circuits. A signal of a bit line is input to a gate of an N-channel MOS transistor of one of the latch circuit, and a signal of a bit line is input to a gate of a P-channel MOS transistor of the other latch circuit.

In the conventional sense amplifier circuit constituted in this manner, even when the power supply voltage is varied, it is possible to perform reading-out at a high speed.

However, in both the conventional sense amplifier circuits having one latch circuit and the sense amplifier circuit described in Japanese patent Application Laid-open No. 9-22597, there is a problem that the circuits are prone to be affected by variation in characteristics of elements.

Further, the conventional sense amplifier circuits do not have means for judging whether a normal detection of the potential difference between the pair of significant bit lines has been completed, and the circuits do not have function for detecting reading error. Therefore, there is a problem that the circuits do not have means for transmitting an again-sensing requirement when the potential difference between the pair of bit lines is insufficient.

SUMMARY OF THE INVENTION

It is an object of the present invention to provide a latch type sense amplifier circuit which is less prone to be affected by variation in characteristics of elements and is capable of detecting that a potential difference between a pair of bit lines is insufficient when such a case is caused.

According to one aspect of the present invention, a latch type sense amplifier circuit comprises: first and second latch circuits which output the same output signals when a potential difference between a bit line pair is equal to or greater than a predetermined value, and output different output signals when the potential difference between the bit line pair is less than the predetermined value; and a comparison result signal generating circuit which compares the output signals from the first and second latch circuits and outputs a signal indicative of the comparison result.

In the present invention, the signals in accordance with a potential difference between the bit line pair are output from the first and second latch circuits, and the signal indicative of the comparison result thereof is output from the comparison result signal generating circuit. Therefore, it is possible to judge whether or not the potential difference between the bit line pair is sufficient from this signal. Thus, when the potential difference is insufficient, the detection may be carried out again on the side of the system based on this signal. Further, since the characteristics of elements constituting the first and second latch circuits need not be uniform, the sense amplifier circuit is less prone to be affected by the variation in characteristics of the elements.

DESCRIPTION OF THE PREFERRED EMBODIMENTS

Figure 1:
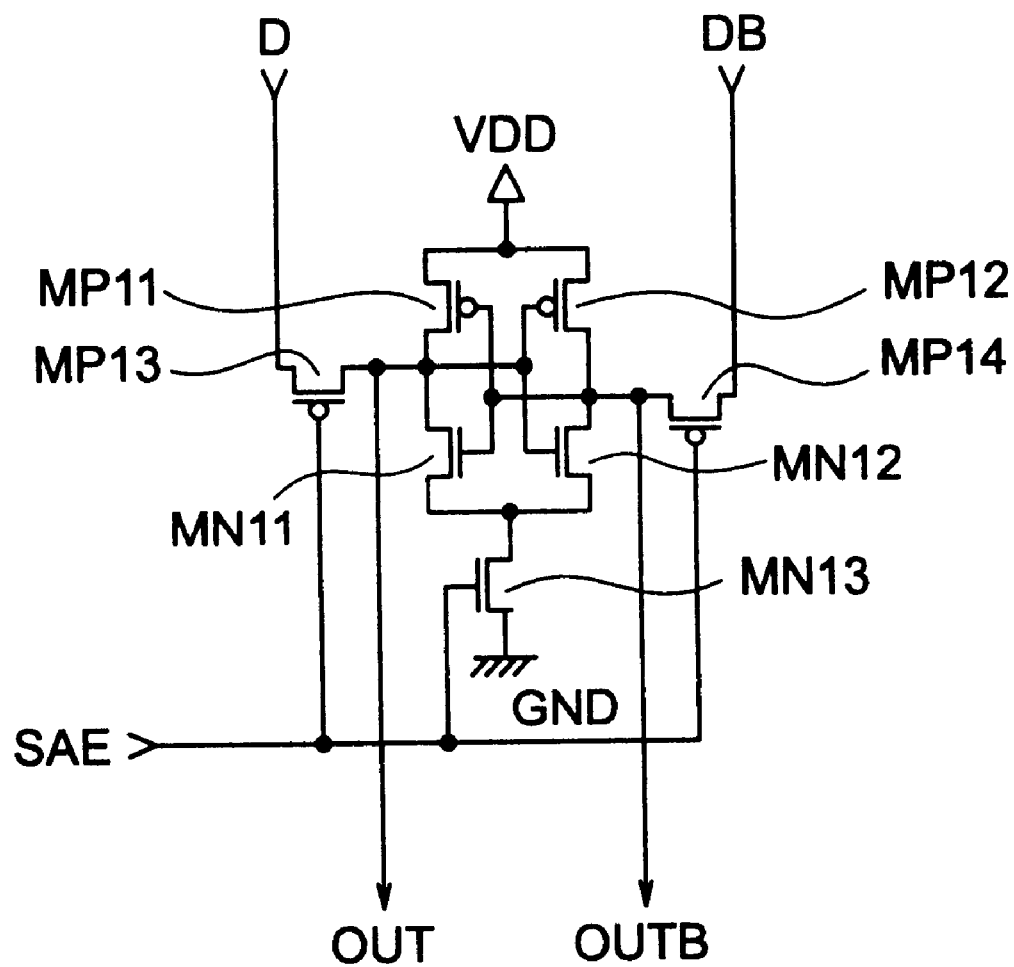
FIG. 1 is a circuit diagram showing a conventional latch type sense amplifier circuit.
Figure 2:
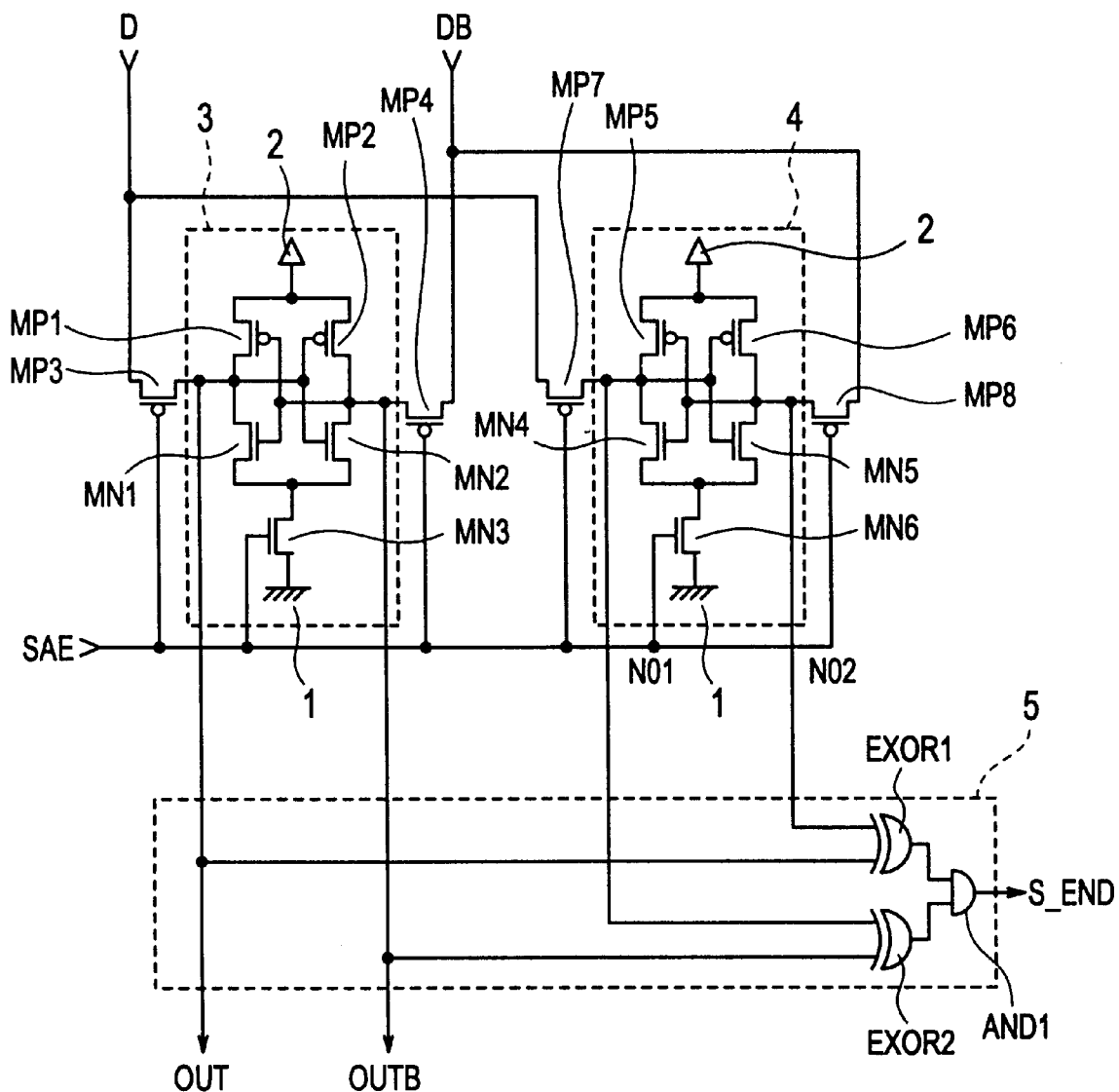
FIG. 2 is a circuit diagram showing a structure of a latch type sense amplifier circuit according to a first embodiment of the present invention.

Latch type sense amplifier circuits of embodiments of the present invention will be explained particularly below with reference to the accompanying drawings. FIG. 2 is a circuit diagram showing a structure of a latch type sense amplifier circuit according to a first embodiment of the present invention.

The first embodiment includes two latch circuits 3 and 4 connected to a pair of bit lines, and a sense completion signal generating circuit 5 for generating a sense completion signal in association with output signals from these circuits 3 and 4. In the present embodiment, the sense completion signal generating circuit 5 corresponds to a comparison result signal generating circuit.

The latch circuit 3 comprises two P-channel MOS transistors MP1 and MP2, as well as two N-channel MOS transistors MN1 and MN2. An absolute value of a threshold voltage (Vt) of the transistor MP1 is set higher than that of the transistor MP2, and Vt of the transistor MN2 is set higher than that of the transistor MN1. Gate lengths and gate widths in the transistors MN1 and MN2 as well as those in the transistors MP1 and MP2 are set equal to each other. That is, of two inverter circuits constituting the latch circuit, a logic threshold value of one of the inverter circuits located at left side in FIG. 2 comprising the transistors MN1 and MP1 is set lower than that of the other inverter circuit located at right side in FIG. 2 comprising the transistors MN2 and MP2.

Further, there is provided a P-channel MOS transistor MP3 connected between a bit line to which a signal D read from a memory cell is transmitted and drains of the transistors MP1 and MN1. There is provided a P-channel MOS transistor MP4 connected between a bit line to which a signal DB read from a memory cell is transmitted and drains of the transistors MP2 and MN2. Connection between the latch circuit 3 and the bit lines is controlled by the transistors MP3 and MP4. Further, there is provided an N-channel MOS transistor MN3 connected between a grounding and sources of the transistors MN1 and MN2. ON/OFF of the latch circuit 3 is controlled by this transistor MN3.

A signal line to which a sense amplifier enable signal SAE is transmitted is connected to gates of the transistors MP3, MP4 and MN3. An output signal OUT is output from between the transistor MP3 and the transistors MP1 and MN1, and an output signal OUTB, which is a complementary signal of the output signal OUT, is output from between the transistor MP4 and the transistors MP2 and MN2.

A source of the transistors MN3 is connected to a grounding 1, and sources of the transistors MP1 and MP2 are connected to a power source 2.

By configuring the latch circuit 3 in this manner, it is possible to obtain a low output signal OUT with a smaller potential difference between the bit lines (D, DB) as compared with a case in which a low output signal OUT is made high.

On the other hand, the latch circuit 4 comprises two P-channel MOS transistors MP5 and MP6, and two N-channel MOS transistors MN4 and MN5. An absolute value of a threshold voltage (Vt) of the transistor MP6 is set higher than that of the transistor MP5, and Vt of the transistor MN4 is set higher than that of the transistor MN5. Gate lengths and gate widths in the transistors MN4 and MN5 as well as those in the transistors MP5 and MP6 are set equal to each other. That is, of two inverter circuits constituting the latch circuit, a logic threshold value of one of the inverter circuits located at left side in FIG. 2 comprising the transistors MU4 and MP5 is set higher than that of the other inverter circuit located at right side in FIG. 2 comprising the transistors MN5 and MP6.

Further, there is provided a P-channel MOS transistor MP7 connected between the bit line to which the signal D is transmitted and drains of the transistors MP5 and MN4. There is provided a P-channel MOS transistor MP8 connected between the bit line to which the signal DB is transmitted and drains of the transistors MP6 and MN5. Connection between the latch circuit 4 and the bit lines is controlled by the transistors MP7 and MP8. Further, there is provided an N-channel MOS transistor MN6 connected between a grounding and sources of the transistors MN4 and MN5. ON/OFF of the latch circuit 4 is controlled by this transistor MN6.

The signal line to which the sense amplifier enable signal SAE is transmitted is connected to gates of the transistors MP7, MP8 and MN6. An output signal NOI is output from between the transistor MP7 and the transistors MP5 and MN4, and an output signal N02, which is a complementary signal of the output signal N01, is output from between the transistor MP8 and the transistors MP6 and MN5.

A source of the transistors MN6 is connected to a grounding 1, and sources of the transistors MP5 and MP6 are connected to a power source 2.

By configuring the latch circuit 4 in this manner, it is possible to obtain a high output signal N01 with a smaller potential difference between the bit lines (D, DB) as compared with a case in which a high output signal N01 is made low.

In this manner, the signals D and DB of the pair of bit lines are input to both the latch circuits 3 and 4, and complementary signals of the output signals OUT and OUTB as well as output signals N01 and N02 are output from the respective latch circuits 3 and 4. The output signals OUT and OUTB from the latch circuit 3 are also output outside.

Further, the sense completion signal generating circuit 5 is provided with an exclusive OR gate EXOR1 for taking an exclusive OR operation of the output signal OUT and the output signal N02. The sense completion signal generating circuit 5 is provided with an exclusive OR gate EXOR2 for performing an exclusive OR operation of the output signal OUTB and the output signal N01. Further, there is provided an AND gate AND1 for taking an AND operation of output signals of the exclusive OR gates EXOR1 and EXOR2. The output signal of the AND gate AND1 becomes the sense completion signal S_END. In the sense completion signal generating circuit 5, after the sense amplifier enable signal SAE becomes high and sensing operation is started, an exclusive OR signal of the output signals OUT and N02 is generated, and an exclusive OR signal of the output signals OUTB and N01 are generated. Thereafter an AND thereof is output as a sense completion signal S_END.

Therefore, after the sensing operation is started, when the same values are obtained in both a combination of the output signal OUT and the output signal N01 and a combination of the output signal OUTB and the output signal N02, the sense completion signal S_END becomes high. Then, a signal indicative of the sensing completion is transmitted to a system. On the other hand, if different values are obtained in both the combination of the output signal OUT and the output signal N01 and the combination of the output signal OUTB and the output signal N02, the sense completion signal S_END remains low and is not varied. Therefore, in this case, the signal indicative of the sensing completion is not transmitted to the system.

Figure 3:
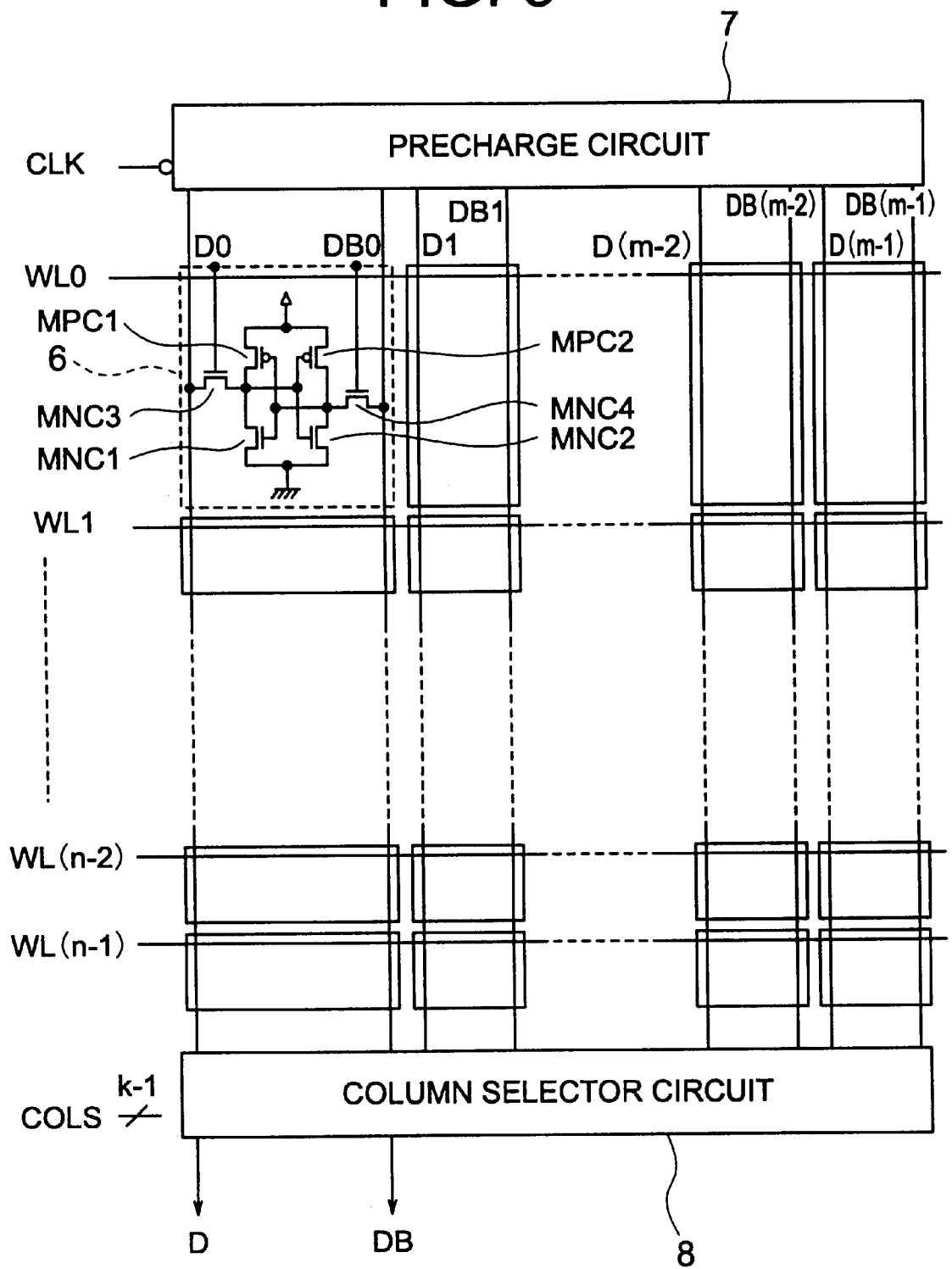
FIG. 3 is a block diagram showing a structure of a memory cell array to which the latch type sense amplifier circuit according to the first embodiment of the invention is applied.

Next, a memory cell array to which the latch type sense amplifier circuit constructed in the above-described manner is applied will be explained. That is, a circuit for generating the signals D and DB will be explained. FIG. 3 is a block diagram showing a structure of the memory cell array to which the latch type sense amplifier circuit according to the present embodiment of the invention is applied.

The memory cell array is provided with memory cells constituting m columns and n rows for one bit (m=2 k, k and n: natural numbers). M sets of pair of bit lines provided in this memory cell array are connected to a precharge circuit 7 and a column selector circuit 8. The signals D and DB are output from the column selector circuit 8.

Signals D0, DB0, D1, DB1, . . . , D(m−2), DB(m−2), D(m−1) and DB(m−1) are transmitted to the m sets of bit lines. A word line is connected to each of the rows, and signals WL0, WL1, . . . WL(n−2) and WL(n−1) are transmitted to the n word lines. For example, an SRAM cell 6 located on the first row from the left and first column from the top is a single port comprising two load P-channel MOS transistors MPC1 and MPC2 and four N-channel MOS transistors MNC1 to MNC4. Other (m×n−1) memory cells also have the same structures.

In the memory cell array structured in this manner, when a clock signal CLK is low, m sets of bit line pairs are precharged at a power supply potential by the precharge circuit 7. Then, one set of the m sets of bit line pairs is selected by the column selector circuit 8, which uses k column selection signals COLS as selection signal, and the selected signal is output from the column selector circuit 8 as the signals D and DB.

The structure of the SRAM cell is not limited to the single port, and the present invention can be applied even when the SRAM cell is formed into a resistance load type cell or a multi-port configuration.

Figure 4:
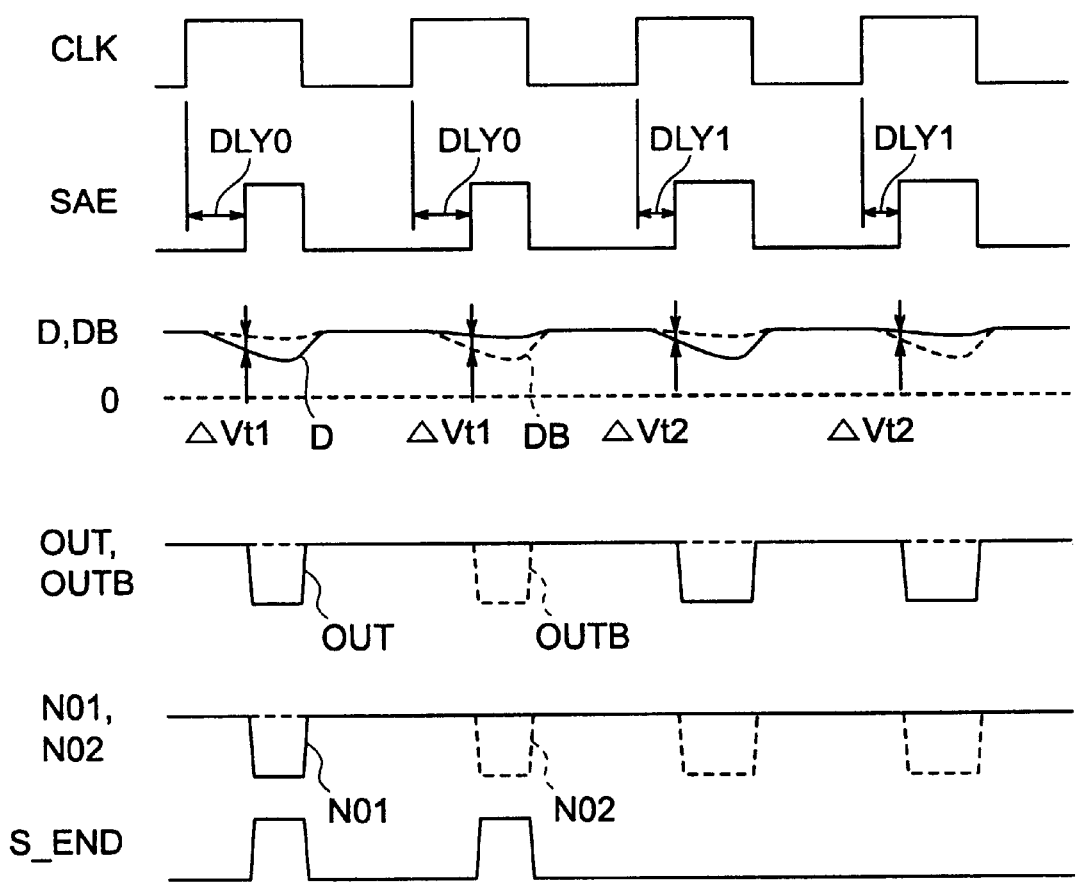
FIG. 4 is a timing chart showing an operation of the latch type sense amplifier circuit according to the first embodiment of the invention.

Next, the operation of the first embodiment in which the invention is applied to the above-described memory cell array will be explained. FIG. 4 is a timing chart showing operation of the latch type sense amplifier circuit according to the first embodiment of the invention. The SRAM circuit is synchronous with the clock signal CLK, and FIG. 4 shows different operations corresponding to four cycles of the clock signal CLK.

During a first clock cycle, after the rise of the clock signal CLK, one of the word lines WL0 to WL(n−1) is selected and rises, a cell in which "0", information is stored is accessed. Then, after a delay time DLY0 is elapsed, the sense amplifier enable signal SAE rises, the latch circuits 3 and 4 start operating and then, a low output signal OUT is output.

While the clock signal CLK is low, the bit lines are precharged to a precharge level by the precharge circuit 7. Thereafter, when the word line rises, the signals D and DB are transmitted to the bit line pair, and potential difference is generated between the bit line pair. The precharge level of the bit lines in the present embodiment is sufficiently higher than the logical threshold values of the exclusive OR gates EXOR1 and EXOR2 in the sense completion signal generating circuit 5.

As described above, since the cell storing the "0" information is accessed in the first clock cycle, potential in a bit line to which the signal D is transmitted is lowered earlier than that in a bit line to which the signal DB is transmitted. In the bit line to which the signal DB is transmitted, potential is lowered only by an amount corresponding to leak current in the SRAM cell.

At this time, the potential difference $\Delta Vt1$ between the bit line pair is sufficiently great at the time of start of sensing operation, and the latch circuits 3 and 4 can normally detect the information stored in the SRAM cell. Therefore, the output signals OUT and N01 become low, and the output signal OUTB and N02 become high. Thus, when the signals are changed, the sense completion signal S_END, which is the output signal of the sense completion signal generating circuit 5, is changed from low to high, and the sense completion signal SEND falls synchronously with fall of the sense amplifier enable signal SAE.

In a second clock cycle, after the clock signal CLK rises, one of the word lines WL0 to WL(n−1) is selected and rises, a cell in which "1" information is stored is accessed. Then, after a delay time DLY0 is elapsed, the sense amplifier enable signal SAE rises, the latch circuits 3 and 4 start operating and then, a high output signal OUT is output.

As described above, in the second clock cycle, since the cell storing the "1" information is accessed, after the word line rises, potential in a bit line to which the signal DB is transmitted is lowered earlier than that in a bit line to which the signal D is transmitted.

At this time, the potential difference $\Delta Vt1$ between the bit line pair is sufficiently great at the time of start of sensing operation, and the latch circuits 3 and 4 can normally detect the information stored in the SRAM cell. Therefore, the output signals OUT and N01 become high, and the output signal OUTB and N02 become low. Thus, when the signals are changed, the sense completion signal S_END, which is the output signal of the sense completion signal generating circuit 5, is changed from low to high, and the sense completion signal S_END falls synchronously with fall of the sense amplifier enable signal SAE.

In a third clock cycle, after the clock signal CLK rises, one of the word lines WL0 to WL(n−1) is selected and rises, a cell in which "0" information is stored is accessed. Then, after a delay time DLY1 is elapsed, the sense amplifier enable signal SAE rises and the latch circuits 3 and 4 start operating, but the potential difference between the bit line pair is small, and a reading-out error is generated.

Since the cell storing the "0" information is accessed in the third clock cycle, potential in a bit line to which the signal D is transmitted is lowered earlier than that in a bit line to which the signal DB is transmitted.

At this time, the potential difference ΔVt2 between the bit line pair is smaller than the potential difference ΔVt1 at the time of start of sensing operation, but in the latch circuit 3, the logic threshold value of the inverter circuit comprising the transistors MN2 and MP2 having gates to which potential of the bit line receiving the signal D is higher than that of the other inverter circuit. Therefore, it is possible to normally detect the information stored in the SRAM cell. However, in the other latch circuit 4, the logic threshold value of the inverter circuit comprising the transistors MN5 and MP6 having gates to which potential of the bit line receiving the signal D is lower than that of the other inverter circuit. Thus, the output signal N02 becomes low and the output signal N01 becomes high. Therefore, after the sensing operation is started, the output signal OUT becomes low, the output signal OUTB becomes high, the output signal N01 becomes high and the output signal N02 becomes low. Thus, the sense completion signal S_END, which is the output signal of the sense completion signal generating circuit 5, remains low and is not varied.

In a fourth clock cycle, after the clock signal CLK rises, one of the word lines WL0 to WL(n−1) is selected and rises, a cell in which "1" information is stored is accessed. Then, after a delay time DLY1 is elapsed, the sense amplifier enable signal SAE rises and the latch circuits 3 and 4 start operating, but the potential difference between the bit line pair is small, and a reading-out error is generated.

Since the cell storing the "1" information is accessed in the third clock cycle, potential in a bit line to which the signal DB is transmitted is lowered earlier than that in a bit line to which the signal D is transmitted.

At this time, the potential difference ΔVt2 between the bit line pair is smaller than the potential difference ΔVt1 at the time of start of sensing operation, but in the latch circuit 4, the logic threshold value of the inverter circuit comprising the transistors MN4 and MP5 having gates to which potential of the bit line to which the signal DB is transmitted is input is higher than that of the other inverter circuit. Therefore, it is possible to normally detect the information stored in the SRAM cell. However, in the other latch circuit 3, the logic threshold value of the inverter circuit comprising the transistors MN1 and MP1 having gates to which potential of the bit line to which the signal DB is transmitted is input is lower than that of the other inverter circuit. Thus, the output signal OUT becomes low and the output signal OUTB becomes high. Therefore, after the sensing operation is started, the output signal OUT becomes low, the output signal OUTB becomes high, the output signal N01 becomes high and the output signal N02 becomes low. Thus, the sense completion signal S_END which is the output signal of the sense completion signal generating circuit 5 remains low and is not varied.

As described above, since two latch circuits having asymmetrical transistor structures are combined in the present embodiment, operation margin with respect to variation in characteristics of elements is previously incorporated in the sense amplifier circuit. Therefore, the sense amplifier circuit can sense stably with a low power supply voltage.

Further, in the present embodiment, since it is possible to generate the sense completion signal S_END indicative of completion of sense of a significant potential difference between bit lines, when this is utilized in the system, it is possible to construct a more stable system.

Figure 5:
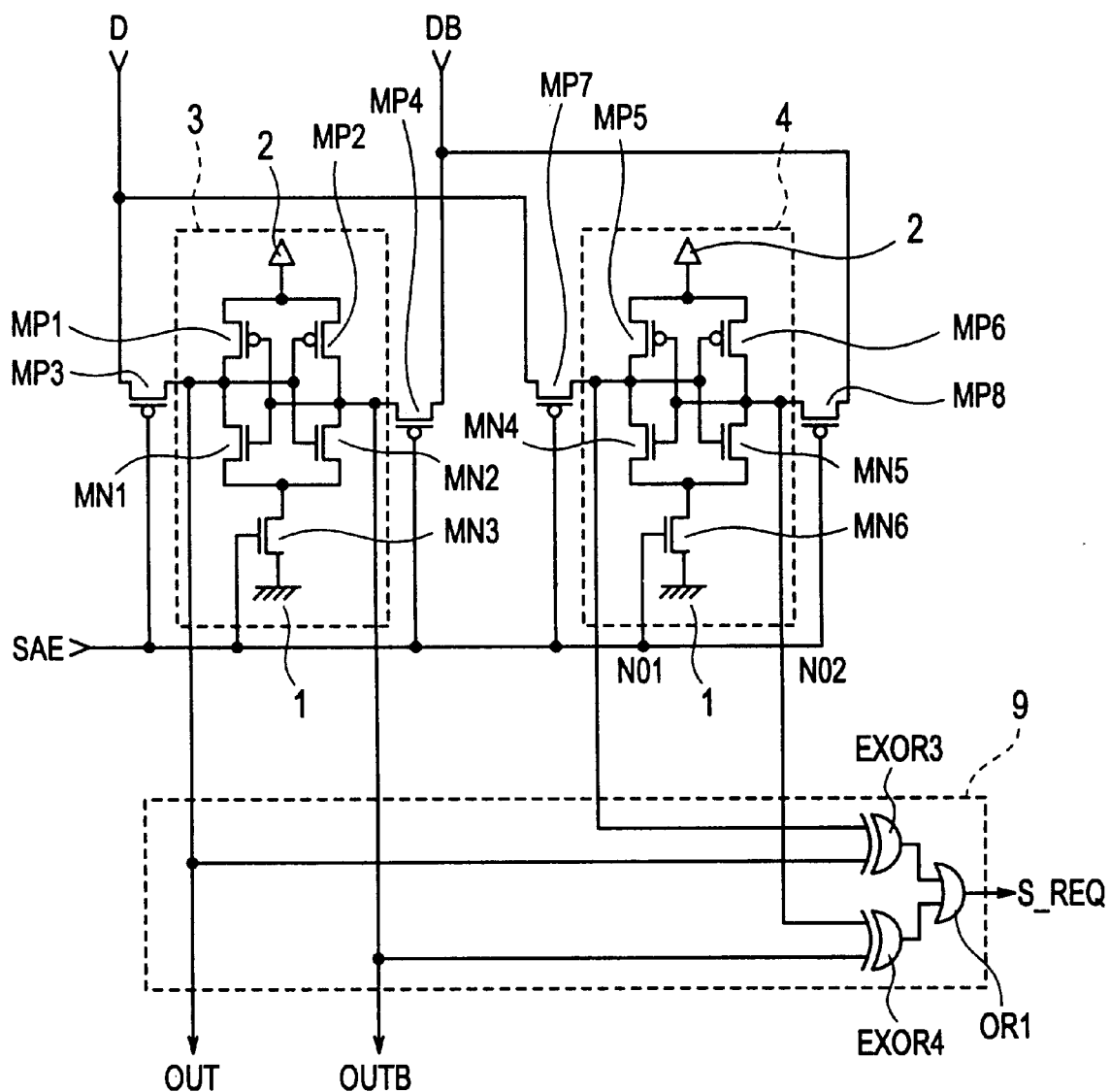
FIG. 5 is a circuit diagram showing a structure of a latch type sense amplifier circuit according to a second embodiment of the invention.

Next, a second embodiment of the present invention will be explained. In the second embodiment, the connection relationship of the output signals from the two latch circuits 3 and 4 is different from that of the first embodiment, and a signal requesting the system to re-sense operation can be generated at the time of reading-out error. FIG. 5 is a circuit diagram showing a structure of a latch type sense amplifier circuit according to the second embodiment of the invention. In the second embodiment shown in FIG. 5, constituent elements similar to those of the first embodiment shown in FIG. 2 are designated with the same reference numerals, and detailed explanation thereof is omitted.

The second embodiment includes two latch circuits 3 and 4, and a re-sense requiring signal generating circuit 9 for generating a re-sense requiring signal in association with output signals from these circuits 3 and 4. In the present embodiment, the re-sense requiring signal generating circuit 9 corresponds to the comparison result signal generating circuit.

The re-sense requiring signal generating circuit 9 is provided with an exclusive OR gate EXOR3 for taking an exclusive OR operation of the output signal OUT and the output signal N01, and an exclusive OR gate EXOR4 for taking an exclusive OR of the output signal OUTB and the output signal N02. Further, there is provided an OR gate OR1 for taking an OR operation of output signals of the exclusive OR gates EXOR1 and EXOR2. The output signal of the OR gate OR1 becomes the sense completion signal S_END. In the re-sense requiring signal generating circuit 9, after the sense amplifier enable signal SAE becomes high and sensing operation is started, an exclusive OR signal of the output signals OUT and N01 is generated, and an exclusive OR signal of the output signals OUTB and N02 are generated. Then, an OR thereof is output as the re-sense requiring signal S_REQ.

Therefore, after the sensing operation is started, if different values are obtained in both a combination of the output signal OUT and the output signal N01 and a combination of the output signal OUTB and the output signal N02, the re-sense requiring signal S_REQ becomes high. Then, a signal indicative of the re-sense requirement is transmitted to a system, on the other hand, if the same values are obtained in both the combination of the output signal OUT and the output signal N01 and the combination of the output signal OUTB and the output signal N02, the re-sense requiring signal S_REQ remains low and is not varied. Therefore, in this case, the signal indicative of the re-sense requirement is not transmitted to the system.

Figure 6:
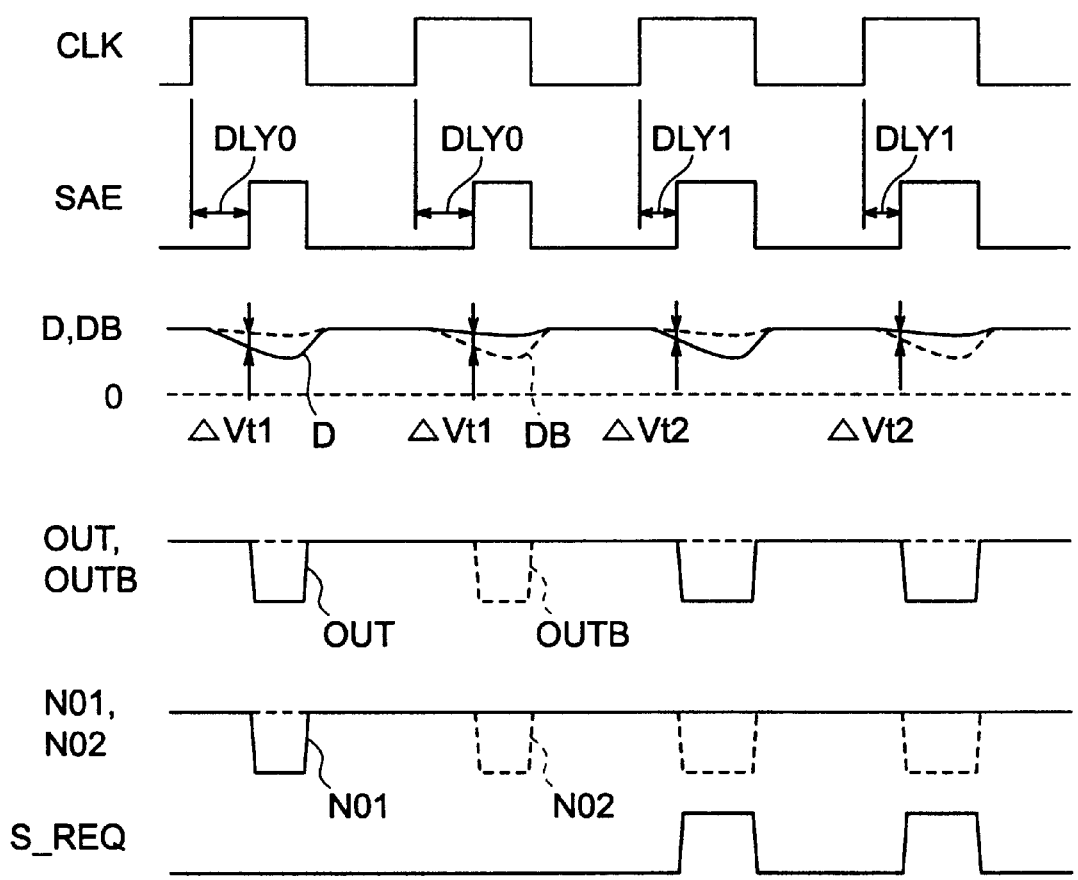
FIG. 6 is a timing chart showing an operation of the latch type sense amplifier circuit according to the second embodiment of the invention.

Next, operation of the second embodiment in which the invention is applied to the above-described memory cell array shown in FIG. 3 will be explained. FIG. 6 is a timing chart showing operation of the latch type sense amplifier circuit according to the second embodiment of the invention. The SRAM circuit is synchronous with the clock signal CLK, and FIG. 6 shows different operations corresponding to four cycles of the clock signal CLK.

During a first clock cycle, after the rise of the clock signal CLK, one of the word lines WL0 to WL(n−1) is selected and rises, a cell in which "0" information is stored is accessed. Then, after a delay time DLY0 is elapsed, the sense amplifier enable signal SAE rises and the latch circuits 3 and 4 start operating and then, a low output signal OUT is output.

While the clock signal CLK is low, the bit line is precharged to a precharge level by the precharge circuit 7. Thereafter, when the word line rises, the signals D and DB are transmitted to the bit line pair, and potential difference is generated between the bit line pair. The precharge level of the bit lines in the present embodiment is sufficiently higher than the threshold values of the exclusive OR gates EXOR3 and EXOR4 in the re-sense requiring signal generating circuit 9.

As described above, since the cell storing the "0" information is accessed in the first clock cycle, potential in a bit line to which the signal D is transmitted is lowered earlier than a bit line to which the signal DB is transmitted. In the bit line to which the signal DB is transmitted, potential is lowered only in a slight amount corresponding to leak current in the SRAM cell.

At this time, the potential difference ΔVt1 between the bit line pair is sufficiently great at the time of start of sensing operation, and the latch circuits 3 and 4 can normally detect the information stored in the SRAM cell. Therefore, the output signals OUT and NOI become low, and the output signal OUTB and N02 become high. Thus, after the sensing operation is started, the output signal OUT and the output signal N01 coincide with each other and the output signal OUTB and the output signal N02 coincide with each other. Therefore, the re-sense requiring signal S_REQ, which is the output signal of the re-sense requiring signal generating circuit 9, remains low and is not varied.

In a second clock cycle, after the clock signal CLK rises, one of the word lines WL0 to WL(n−1) is selected and rises, a cell in which "1" information is stored is accessed. Then, after a delay time DLY0 is elapsed, the sense amplifier enable signal SAE rises and the latch circuits 3 and 4 start operating and then, a high output signal OUT is output.

As described above, in the second clock cycle, since the cell storing the "1" information is accessed, after the word line rises, potential in a bit line to which the signal DB is transmitted is lowered earlier than a bit line to which the signal D is transmitted.

At this time, the potential difference ΔVt1 between the bit line pair is sufficiently great at the time of start of sensing operation, and the latch circuits 3 and 4 can normally detect the information stored in the SRAM cell. Therefore, the output signals OUT and N01 become high, and the output signal OUTB and N02 become low. Thus, after the sensing operation is started, the output signal OUT and the output signal N01 coincide with each other and the output signal OUTB and the output signal N02 coincide with each other. Therefore, the re-sense requiring signal S_REQ, which is the output signal of the re-sense requiring signal generating circuit 9, remains low and is not varied.

In a third clock cycle, after the clock signal CLK rises, one of the word lines WL0 to WL(n−1) is selected and rises, a cell in which "0" information is stored is accessed. Then, after a delay time DLY1 is elapsed, the sense amplifier enable signal SAE rises and the latch circuits 3 and 4 start operating, but the potential difference between the bit line pair is small, and a reading-out error is generated.

Since the cell storing the "0" information is accessed in the third clock cycle, potential in a bit line to which the signal D is transmitted is lowered earlier than a bit line to which the signal DB is transmitted.

At this time, the potential difference ΔVt2 between the bit line pair is smaller than the potential difference ΔVt1 at the time of start of sensing operation, but in the latch circuit 3, the logic threshold value of the inverter circuit comprising the transistors MN2 and MP2 having gates to which potential of the bit line to which the signal D is transmitted is input is higher than that of the other inverter circuit. Therefore, it is possible to normally detect the information stored in the SRAM cell. However, in the other latch circuit 4, the logic threshold value of the inverter circuit comprising the transistors MN5 and MP6 having gates to which potential of the bit line to which the signal D is transmitted is input is lower than that of the other inverter circuit. Thus, the output signal N02 becomes low and the output signal N01 becomes high. Therefore, when the signals are changed, the re-sense requiring signal SREQ, which is the output signal of the re-sense requiring signal generating circuit 9, is changed from low to high. Then, the re-sense requiring signal S_REQ falls synchronously with fall of the sense amplifier enable signal SAE.

In a fourth clock cycle, after the clock signal CLK rises, one of the word lines WL0 to WL(n−1) is selected and rises, a cell in which "1" information is stored is accessed. Then, after a delay time DLY1 is elapsed, the sense amplifier enable signal SAE rises and the latch circuits 3 and 4 start operating, but the potential difference between the bit line pair is small, and a reading-out error is generated.

Since the cell storing the "1" information is accessed in the fourth clock cycle, potential in a bit line to which the signal DB is transmitted is lowered earlier than a bit line to which the signal D is transmitted.

At this time, the potential difference ΔVt2 between the bit line pair is smaller than the potential difference ΔVt1 at the time of start of sensing operation, but in the latch circuit 4, the logic threshold value of the inverter circuit comprising the transistors MN4 and MP5 having gates to which potential of the bit line to which the signal DB is transmitted is input is higher than that of the other inverter circuit. Therefore, it is possible to normally detect the information stored in the SRAM cell. However, in the other latch circuit 3, the logic threshold value of the inverter circuit comprising the transistors MN1 and MP1 having gates to which potential of the bit line to which the signal DB is transmitted is input is lower than that of the other inverter circuit. Thus, the output signal OUT becomes low and the output signal OUTB becomes high. Therefore, when the signals are changed, the re-sense requiring signal S_REQ, which is the output signal of the re-sense requiring signal generating circuit 9, is changed from low to high. Then, the re-sense requiring signal S_REQ falls synchronously with fall of the sense amplifier enable signal SAE.

As described above, in the second embodiment, since the sensing operation is started and the reading-out error is detected before a significant potential difference between the bit line pair is generated, it is possible to transmit the re-sense requiring signal to the system. Therefore, when this is utilized in the system, it is possible to construct more stable system.

Figure 7:
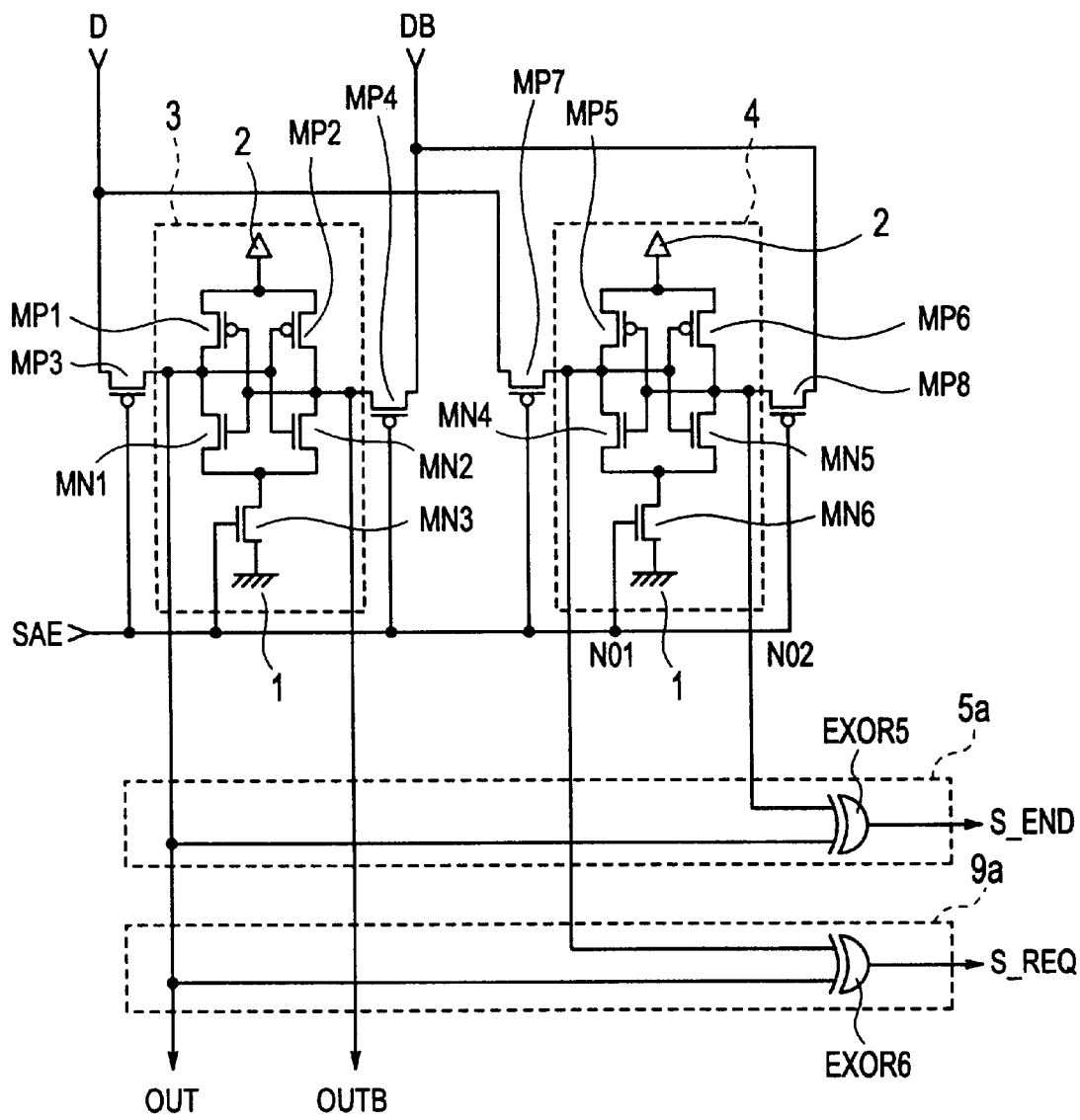
FIG. 7 is a circuit diagram showing a structure of a latch type sense amplifier circuit according to a third embodiment of the invention.

Next, a third embodiment of the present invention will be explained. In the first and second embodiments, the circuits are formed such that all the output signals OUT, OUTS, N01 and N02 of the two latch circuits 3 and 4 are input to input terminals of the exclusive OR gates. And load capacities with respect to the bit line pair are equal to each other. However, when the capacities of the exclusive ORS EXOR1, EXOR2, EXOR3 and EXOR4 in the sense completion signal generating circuit 5 or the re-sense requiring signal generating circuit 9 are sufficiently smaller than the capacities of the bit lines, it is unnecessary to consider the symmetry of loads of complementary signal terminals of the latch circuit. Therefore, the structure of each of the sense completion signal generating circuit and the re-sense requiring signal generating circuit can be simplified as compared with that in the first and second embodiment. In the third embodiment, simplification of the structure of each of the sense completion signal generating circuit and the re-sense requiring signal generating circuit has been realized. FIG. 7 is a circuit diagram showing a structure of the latch type sense amplifier circuit according to the third embodiment of the invention. In the third embodiment shown in FIG. 7, constituent elements similar to those of the first embodiment shown in FIG. 2 are designated with the same reference numerals, and detailed explanation thereof is omitted.

The third embodiment includes two latch circuits 3 and 4, a sense completion signal generating circuit 5a for generating a sense completion signal and a re-sense requiring signal generating circuit 9a for generating a re-sense requiring signal. In the present embodiment, the sense completion signal generating circuit 5a and the re-sense requiring signal generating circuit 9a correspond to the comparison result signal generating circuit.

The sense completion signal generating circuit 5a is provided with an exclusive OR gate EXOR5 for taking an exclusive OR of the output signal OUT and the output signal N02, and the output signal of the exclusive OR gate EXOR5 becomes the sense completion signal S_END. In the sense completion signal generating circuit 5a, after the sense amplifier enable signal SAE becomes high and sensing operation is started, an exclusive OR signal of the output signals OUT and N02 is generated, and this signal is output as a sense completion signal S_END.

The re-sense requiring signal generating circuit 9a is provided with an exclusive OR gate EXOR6 for taking an exclusive OR of the output signal OUT and the output signal N01, and the output signal of the exclusive OR gate EX OR6 becomes the re-sense requiring signal S_REQ. In the re-sense requiring signal generating circuit 9a, after the sense amplifier enable signal SAE becomes high and sensing operation is started, an exclusive OR signal of the output signals OUT and N01 is generated, and this signal is output as the re-sense requiring signal S_REQ.

Therefore, after the sensing operation is started, when the value of the output signals OUT and N02 are different from each other, the sense completion signal S_END becomes high, and a signal indicative of completion of the sensing operation is transmitted to the system. On the other hand, after the sensing operation is started, when the value of the output signals OUT and N02 are the same, the sense completion signal S_END remains low and is not varied. Thus, in this case, the signal indicative of completion of the sensing operation is not transmitted to the system.

Further, after the sensing operation is started, when the value of the output signals OUT and N01 are different from each other, the re-sense requiring signal S_REQ becomes high, and a signal indicative of re-sense requirement is transmitted to the system. On the other hand, after the sensing operation is started, when the value of the output signals OUT and N01 are the same, the re-sense requiring signal S_REQ remains low and is not varied. Thus, in this case, the signal indicative of re-sense requirement is not transmitted to the system.

Since the output signals N01 and N02 are complementary signals, when the output signals OUT and N01 coincide with each other, the output signals OUT and N02 do not coincide with each other, and when the output signals OUT and N01 do not coincide with each other, the output signals OUT and N02 coincide with each other.

Figure 8:
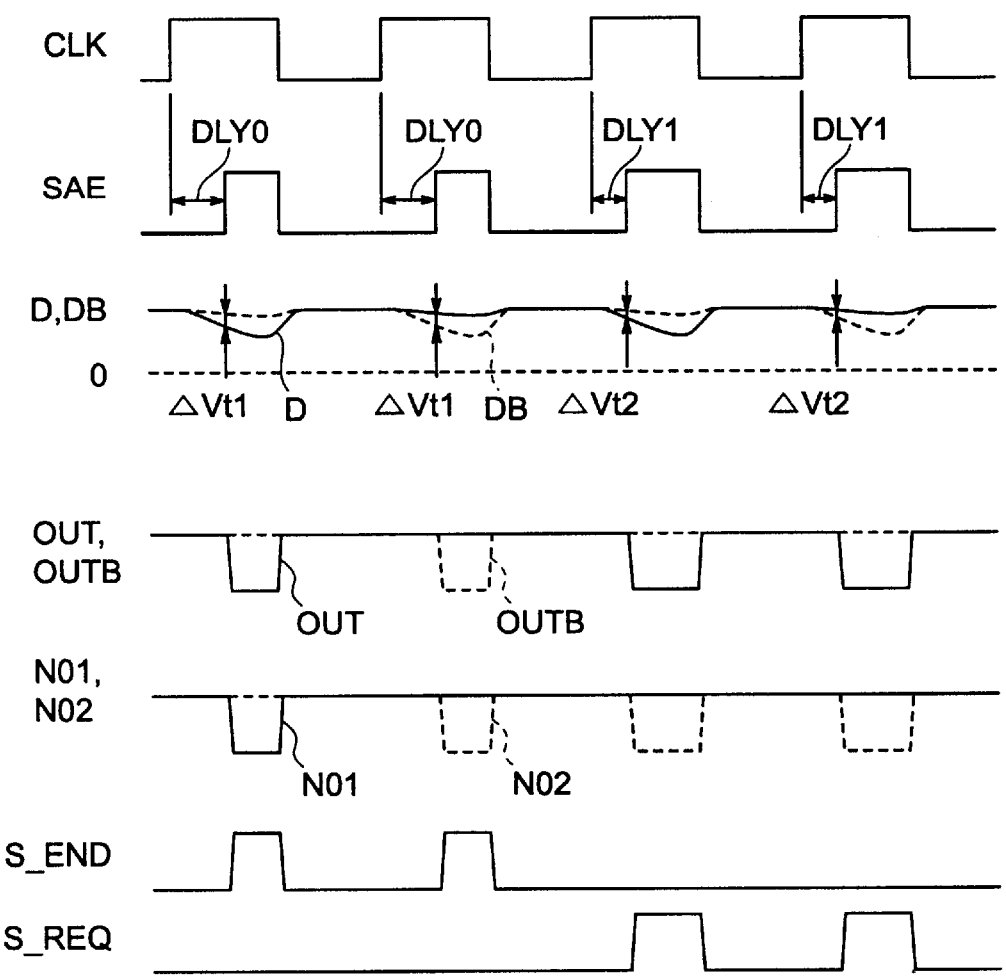
FIG. 8 is a timing chart showing an operation of the latch type sense amplifier circuit according to the third embodiment of the invention.

Next, operation of the third embodiment in which the invention is applied to the above-described memory cell array shown in FIG. 3 will be explained. FIG. 8 is a timing chart showing an operation of the latch type sense amplifier circuit of the third embodiment of the invention. The SRAM circuit is synchronous with the clock signal CLK, and FIG. 8 shows different operations corresponding to four cycles of the clock signal CLK. The operation in each of the clock cycles is the same as those explained in the first and second embodiments.

During a first clock cycle, after the rise of the clock signal CLK, one of the word lines WL0 to WL(n−1) is selected and rises, a cell in which "0" information is stored is accessed. Then, after a delay time DLY0 is elapsed, the sense amplifier enable signal SAE rises and the latch circuits 3 and 4 start operating and then, a low output signal is output.

While the clock signal CLK is low, the bit lines are precharged to a precharge level by the precharge circuit 7. Thereafter, when the word line rises, the signals D and DB are transmitted to the bit line pair, and potential difference is generated between the bit line pair. The precharge level of the bit lines in the present embodiment is sufficiently higher than the threshold values of the exclusive OR gate EXOR5 in the sense completion signal generating circuit 5 and the exclusive OR gate EXOR6 in the re-sense requiring signal generating circuit 9.

As described above, in the first clock cycle, since the cell storing the "0" information is accessed, potential in a bit line to which the signal D is transmitted is lowered earlier than a bit line to which the signal DB is transmitted. In the bit line to which the signal DB is transmitted, potential is lowered only in a slight amount corresponding to leak current in the SRAM cell.

At this time, the potential difference $\Delta Vt1$ between the bit line pair is sufficiently great at the time of start of sensing operation, and the latch circuits 3 and 4 can normally detect the information stored in the SRAM cell. Therefore, the output signals OUT and N01 become low, and the output signal OUTB and N02 become high. Thus, after the sensing operation is started, the output signal OUT and the output signal N01 coincide with each other and the output signal OUTB and the output signal N02 coincide with each other. Therefore, the re-sense requiring signal S_REQ, which is the output signal of the re-sense requiring signal generating circuit 9, remains low and is not varied. On the other hand, the sense completion signal S_END, which is the output signal of the sense completion signal generating circuit 5, is changed from low to high, and the sense completion signal S_END falls synchronously with fall of the sense amplifier enable signal SAE.

In a second clock cycle, after the clock signal CLK rises, one of the word lines WL0 to WL(n−1) is selected and rises, a cell in which "1" information is stored is accessed. Then, after a delay time DLY0 is elapsed, the sense amplifier enable signal SAE rises and the latch circuits 3 and 4 start operating and then, a high output signal OUT is output.

As described above, in the second clock cycle, since the cell storing the "1" information is accessed, after the word line rises, potential in a bit line to which the signal DB is transmitted is lowered earlier than a bit line to which the signal D is transmitted.

At this time, the potential difference $\Delta Vt1$ between the bit line pair is sufficiently great at the time of start of sensing operation, and the latch circuits 3 and 4 can normally detect the information stored in the SRAM cell. Therefore, the output signals OUT and N01 become high, and the output signal OUTB and N02 become low. Thus, after the sensing operation is started, the output signal OUT and the output signal N01 coincide with each other and the output signal OUTB and the output signal N02 coincide with each other. Therefore, the re-sense requiring signal S_REQ, which is the output signal of the re-sense requiring signal generating circuit 9, remains low and is not varied. On the other hand, the sense completion signal S_END, which is the output signal of the sense completion signal generating circuit 5, is changed from low to high, and the sense completion signal S_END falls synchronously with fall of the sense amplifier enable signal SAE.

In a third clock cycle, after the clock signal CLK rises, one of the word lines WL0 to WL(n−1) is selected and rises, a cell in which "0" information is stored is accessed. Then, after a delay time DLY1 is elapsed, the sense amplifier enable signal SAE rises and the latch circuits 3 and 4 start operating, but the potential difference between the bit line pair is small, and a reading-out error is generated.

In the third clock cycle, since the cell storing the "0" information is accessed potential in a bit line to which the signal D is transmitted is lowered earlier than a bit line to which the signal DB is transmitted.

At this time, the potential difference ΔVt2 between the bit line pair is smaller than the potential difference ΔVt1 at the time of start of sensing operation, but in the latch circuit 3, the logic threshold value of the inverter circuit comprising the transistors MN2 and MP2 having gates to which potential of the bit line to which the signal D is transmitted is input higher than that of the other inverter circuit. Therefore, it is possible to normally detect the information stored in the SRAM cell. However, in the other latch circuit 4, the logic threshold value of the inverter circuit comprising the transistors MN5 and MP6 having gates to which potential of the bit line to which the signal D is transmitted is input is lower than that of the other inverter circuit. Thus, the output signal N02 becomes low and the output signal N01 becomes high. Therefore, when the signals are changed, the sense completion signal S_END, which is the output signal of the sense completion signal generating circuit 5, remains low and is not varied. On the other hand, the re-sense requiring signal S_REQ, which is the output signal of the re-sense requiring signal generating circuit 9, is changed from low to high, and the re-sense requiring signal S_REQ falls synchronously with fall of the sense amplifier enable signal SAE.

In a fourth clock cycle, after the clock signal CLK rises, one of the word lines WL0 to WL(n−1) is selected and rises, a cell in which "1" information is stored is accessed. Then, after a delay time DLY1 is elapsed, the sense amplifier enable signal SAE rises and the latch circuits 3 and 4 start operating, but the potential difference between the bit line pair is small, and a reading-out error is generated.

In the fourth clock cycle, since the cell storing the "1" information is accessed, potential in a bit line to which the signal DB is transmitted is lowered earlier than a bit line to which the signal D is transmitted.

At this time, the potential difference ΔVt2 between the bit line pair is smaller than the potential difference ΔVt1 at the time of start of sensing operation, but in the latch circuit 4, the logic threshold value of the inverter circuit comprising the transistors MN4 and MP5 having gates to which potential of the bit line to which the signal DB is transmitted is input is higher than that of the other inverter circuit. Therefore, it is possible to normally detect the information stored in the SRAM cell. However, in the other latch circuit 3, the logic threshold value of the inverter circuit comprising the transistors MN1 and MP1 having gates to which potential of the bit line to which the signal DB is transmitted is input is lower than that of the other inverter circuit. Thus, the output signal OUT becomes low and the output signal OUTB becomes high. Therefore, when the signals are changed, the sense completion signal S_END, which is the output signal of the sense completion signal generating circuit 5, remains low and is not varied. on the other hand, the re-sense requiring signal S_REQ, which is the output signal of the re-sense requiring signal generating circuit 9, is changed from low to high, and the re-sense requiring signal S_REQ falls synchronously with fall of the sense amplifier enable signal SAE.

As described above, in the third embodiment, it is possible to generate a signal which shows stopping of sensing the significant potential difference between the bit lines, and the sensing operation is started and the reading-out error is detected before a significant potential difference between the bit line pair is generated. Therefore, it is possible to transmit the re-sense requiring signal to the system. Therefore, when this signal is utilized in the system, it is possible to construct more stable system.

In the present embodiment, since each of the sense completion signal generating circuit 5 and the re-sense requiring signal generating circuit 9 comprises only the exclusive OR gate EXOR5 and EXOR6, respectively, this embodiment provides a remarkable effect that the same function as those of the first and second embodiment with fewer elements.

In each of the first to third embodiments, since logic threshold values of the two inverter circuits constituting the latch circuit may be different from each other, transistors having different threshold voltages are used. However, when gate width, gate length of the transistors or thickness of gate oxide films are different from each other, the same function can be realized. Further, a combination thereof can also realize the same function.

As described above in detail, according to the present invention, there are provided two latch circuits which output the same output signals or different output signals in association with a potential difference between the bit line pair. Thus, operation margin with respect to variation in characteristics of elements is previously incorporated. Therefore, the detecting operation can be carried out stable with low power supply voltage. The comparison result signal generating circuit for comparing the output signals of the two latch circuits is provided. Therefore, when the potential difference between the bit line pair is insufficient, it is possible to detect this fact. Thus, when the signal is utilized in the system, it is possible to structure more stable system.

What is claimed is:

1. A latch type sense amplifier circuit, comprising:
   first and second latch circuits adapted to receive a same enabling signal and outputting the same output signals when a potential difference between a bit line pair is equal to or greater than a predetermined value, and outputting different output signals when said potential difference between said bit line pair is less than said predetermined value; and
   a comparison result signal generating circuit which compares said output signals from said first and second latch circuits and outputs a signal indicative of the comparison result.

2. A latch type sense amplifier circuit, comprising:
   first and second latch circuits which output the same output signals when a potential difference between a bit line pair is equal to or greater than a predetermined value, and output different output signals when said potential difference between said bit line pair is less than said predetermined value;
   a comparison result signal generating circuit which compares said output signals from said first and second latch circuits and outputs a signal indicative of the comparison result, wherein:

said bit line pair comprises first and second bit lines;

said first latch circuit comprises, a first inverter circuit having two transistors whose drains are connected to said first bit line, and a second inverter circuit having two transistors whose drains are connected to said second bit line, and having a threshold value higher than that of said first inverter circuit, and said second latch circuit comprises, a third inverter circuit having two transistors whose drains are connected to said first bit line, and a fourth inverter circuit having two transistors whose drains are connected to said second bit line, and having a threshold value lower than that of said third inverter circuit.

3. The latch type sense amplifier circuit according to claim 2, wherein said comparison result signal generating circuit comprises:

a first gate which takes an exclusive OR of an output signal of said first inverter circuit and an output signal of said fourth inverter circuit;

a second gate which takes an exclusive OR of an output signal of said second inverter circuit and an output signal of said third inverter circuit; and a third gate which takes an AND of an output signal of said first gate and an output signal of said second gate.

4. The latch type sense amplifier circuit according to claim 2, wherein said comparison result signal generating circuit comprises:

a first gate which takes an exclusive OR of an output signal of said first inverter circuit and an output signal of said third inverter circuit;

a second gate which takes an exclusive OR of an output signal of said second inverter circuit and an output signal of said fourth inverter circuit; and a third gate which takes an OR of an output signal of said first gate and an output signal of said second gate.

5. The latch type sense amplifier circuit according to claim 2, wherein said comparison result signal generating circuit comprises:

a first gate which takes an exclusive OR of an output signal of said first inverter circuit and an output signal of said fourth inverter circuit; and a second gate which takes an exclusive OR of an output signal of said first inverter circuit and an output signal of said third inverter circuit.

6. The latch type sense amplifier circuit according to claim 2, wherein at least one parameter selected from a group composed of a threshold value voltage, a gate width, a gate length and a gate oxide film thickness is/are different between said two transistors constituting said first inverter circuit and said two transistors constituting said second inverter circuit, and at least one parameter selected from a group composed of a threshold value voltage, a gate width, a gate length and a gate oxide film thickness is/are different between said two transistors constituting said third inverter circuit and said two transistors constituting said fourth inverter circuit.

7. The latch type sense amplifier circuit according to claim 3, wherein at least one parameter selected from a group composed of a threshold value voltage, a gate width, a gate length and a gate oxide film thickness is/are different between said two transistors constituting said first inverter circuit and said two transistors constituting said second inverter circuit, and at least one parameter selected from a group composed of a threshold value voltage, a gate width, a gate length and a gate oxide film thickness is/are different between said two transistors constituting said third inverter circuit and said two transistors constituting said fourth inverter circuit.

8. The latch type sense amplifier circuit according to claim 4, wherein at least one parameter selected from a group composed of a threshold value voltage, a gate width, a gate length and a gate oxide film thickness is/are different between said two transistors constituting said first inverter circuit and said two transistors constituting said second inverter circuit, and at least one parameter selected from a group composed of a threshold value voltage, a gate width, a gate length and a gate oxide film thickness is/are different between said two transistors constituting said third inverter circuit and said two transistors constituting said fourth inverter circuit.

9. The latch type sense amplifier circuit according to claim 5, wherein at least one parameter selected from a group composed of a threshold value voltage, a gate width, a gate length and a gate oxide film thickness is/are different between said two transistors constituting said first inverter circuit and said two transistors constituting said second inverter circuit, and at least one parameter selected from a group composed of a threshold value voltage, a gate width, a gate length and a gate oxide film thickness is/are different between said two transistors constituting said third inverter circuit and said two transistors constituting said fourth inverter circuit.

* * * * *

UNITED STATES PATENT AND TRADEMARK OFFICE
CERTIFICATE OF CORRECTION

PATENT NO.    : 6,255,862 B1
DATED         : July 3, 2001
INVENTOR(S)   : Kouichi Kumagai, Hiroaki Iwaki It is certified that error appears in the above-identified patent and that said Letters Patent is hereby corrected as shown below:

Column 4,
Line 25, delete "MU4" insert -- MN4 --;
Line 42, delete "NOI" insert -- N01 --

Column 6,
Line 34, delete "SEND" insert -- S_END --

Column 9,
Line 15, delete "NOI" insert -- N01 --

Column 10,
Line 52, delete "OUTS" insert -- OUTB --

Column 11,
Line 29, delete "EX OR6" insert -- EXOR6 --

Signed and Sealed this

Twenty-sixth Day of February, 2002

JAMES E. ROGAN
*Director of the United States Patent and Trademark Office*

*Attest:*

*Attesting Officer*